(12) United States Patent
Adelmann

(10) Patent No.: US 9,729,187 B1
(45) Date of Patent: Aug. 8, 2017

(54) CASE WITH ELECTRICAL MULTIPLEXING

(71) Applicant: OTTER PRODUCTS, LLC, Fort Collins, CO (US)

(72) Inventor: Todd C. Adelmann, Fort Collins, CO (US)

(73) Assignee: Otter Products, LLC, Fort Collins, CO (US)

( * ) Notice: Subject to any disclaimer, the term of this patent is extended or adjusted under 35 U.S.C. 154(b) by 0 days.

(21) Appl. No.: 15/401,742

(22) Filed: Jan. 9, 2017

Related U.S. Application Data

(60) Provisional application No. 62/289,414, filed on Feb. 1, 2016.

(51) Int. Cl.
  *H04B 1/38* (2015.01)
  *H04B 1/3888* (2015.01)
  *H04M 1/02* (2006.01)

(52) U.S. Cl.
  CPC ........ *H04B 1/3888* (2013.01); *H04M 1/0249* (2013.01); *H04M 1/0258* (2013.01)

(58) Field of Classification Search
  CPC ............................ H04B 1/3888; H04B 1/3883
  USPC ............. 455/575.8, 575.1, 550.1, 90.3, 90.1, 455/556.1, 573, 557, 422.1, 403, 73, 455/426.1, 426.2; 361/679.41, 809; 379/433.01, 433.11, 437, 438, 440, 441, 379/447, 451
  See application file for complete search history.

(56) References Cited

U.S. PATENT DOCUMENTS

| | | | |
|---|---|---|---|
| 4,312,580 A | 1/1982 | Schwomma et al. |
| 4,413,221 A | 11/1983 | Benjamin et al. |
| 4,957,205 A | 9/1990 | Rose |
| 5,140,310 A | 8/1992 | DeLuca et al. |
| 5,311,112 A | 5/1994 | Creaco et al. |
| 5,325,040 A | 6/1994 | Bogut et al. |
| 5,541,813 A | 7/1996 | Satoh et al. |
| 5,583,742 A | 12/1996 | Noda et al. |

(Continued)

FOREIGN PATENT DOCUMENTS

| | | |
|---|---|---|
| CN | 103171477 A | 6/2013 |
| WO | 9400037 A1 | 1/1994 |

(Continued)

OTHER PUBLICATIONS

Branscombe, "The future of Wireless Power: 2. Taking Wireless Power Further", Tom's Guide, Mar. 28, 2011, <http://www.tomsguide.com/us/Wireless-Power-Tesla-Fulton-eCoupled,review-1641-2.html>, last accessed Jun. 11, 2015.

(Continued)

*Primary Examiner* — Keith Ferguson

(57) ABSTRACT

A case for an electronic device includes a shell and at least three electrical connectors. The shell receives the electronic device and covers at least a portion of the electronic device. A first electrical connector is on an interior of the shell and electrically connects the case to an electrical interface of the electronic device when the electronic device is installed in the case. A second electrical connector is on an exterior of the shell and electrically connects a first external electrical device to the electronic device through the electrical interface of the electronic device. A third electrical connector is on the exterior of the shell and electrically connects a second external electrical device to the electronic device.

23 Claims, 6 Drawing Sheets

(56) References Cited

U.S. PATENT DOCUMENTS

| | | | |
|---|---|---|---|
| 5,669,004 | A | 9/1997 | Sellers |
| 5,681,122 | A | 10/1997 | Burke |
| 5,933,812 | A | 8/1999 | Meyer et al. |
| 6,005,368 | A | 12/1999 | Frame |
| 6,043,626 | A | 3/2000 | Snyder et al. |
| 6,058,356 | A | 5/2000 | Swanson et al. |
| 6,129,321 | A | 10/2000 | Minelli et al. |
| 6,169,384 | B1 | 1/2001 | Shannon |
| 6,184,654 | B1 | 2/2001 | Bachner et al. |
| 6,249,256 | B1 | 6/2001 | Luxon et al. |
| 6,304,459 | B1 | 10/2001 | Toyosato et al. |
| 6,317,313 | B1 | 11/2001 | Mosgrove et al. |
| 6,356,058 | B1 | 3/2002 | Maio et al. |
| 6,388,877 | B1 | 5/2002 | Canova et al. |
| 6,405,049 | B2 | 6/2002 | Herrod et al. |
| 6,456,487 | B1 | 9/2002 | Hetterick |
| 6,504,710 | B2 | 1/2003 | Sutton et al. |
| 6,532,152 | B1 | 3/2003 | White et al. |
| 6,538,413 | B1 | 3/2003 | Beard et al. |
| 6,944,782 | B2 | 9/2005 | Mueller et al. |
| 7,116,079 | B2 | 10/2006 | Bayne et al. |
| 7,312,984 | B2 | 12/2007 | Richardson et al. |
| 7,318,521 | B2 | 1/2008 | Lau |
| 7,359,184 | B2 | 4/2008 | Lord |
| 7,400,917 | B2 | 7/2008 | Wood et al. |
| 7,403,613 | B2 | 7/2008 | Liou |
| 7,612,997 | B1 | 11/2009 | Diebel et al. |
| 7,728,551 | B2 | 6/2010 | Reed et al. |
| 7,782,610 | B2 | 8/2010 | Diebel et al. |
| 7,868,585 | B2 | 1/2011 | Sarnowsky et al. |
| 7,876,272 | B2 | 1/2011 | Dou et al. |
| 7,888,629 | B2 | 2/2011 | Heslin et al. |
| 7,889,498 | B2 | 2/2011 | Diebel et al. |
| 8,013,572 | B2 | 9/2011 | Rodgers |
| 8,041,029 | B2 | 10/2011 | Wiegers |
| 8,208,980 | B2 | 6/2012 | Wong et al. |
| 8,214,003 | B2 | 7/2012 | Wong et al. |
| 8,286,013 | B2 | 10/2012 | Chen et al. |
| 8,310,200 | B2 | 11/2012 | Matouka et al. |
| 8,367,235 | B2 | 2/2013 | Huang |
| 8,442,602 | B2 | 5/2013 | Wong et al. |
| 8,541,974 | B2 | 9/2013 | Farahani |
| 8,690,600 | B1 | 4/2014 | Zeolla |
| 8,727,192 | B2 | 5/2014 | Lai |
| 8,750,948 | B2 | 6/2014 | Wong et al. |
| 9,026,187 | B2 | 5/2015 | Huang |
| 9,153,109 | B1 | 10/2015 | Foster et al. |
| 2002/0075003 | A1 | 6/2002 | Fridman et al. |
| 2002/0085403 | A1 | 7/2002 | Cho |
| 2003/0045246 | A1 | 3/2003 | Lee et al. |
| 2003/0095374 | A1 | 5/2003 | Richardson |
| 2003/0220988 | A1 | 11/2003 | Hymel |
| 2005/0188203 | A1 | 8/2005 | Bhaskaran et al. |
| 2005/0189913 | A1 | 9/2005 | Vitanov et al. |
| 2005/0224508 | A1 | 10/2005 | Tajiri et al. |
| 2005/0279661 | A1 | 12/2005 | Hodges |
| 2006/0022889 | A1 | 2/2006 | Chiang et al. |
| 2006/0244422 | A1 | 11/2006 | DiGiovanna et al. |
| 2006/0255493 | A1 | 11/2006 | Fouladpour |
| 2006/0261777 | A1 | 11/2006 | Li et al. |
| 2007/0052600 | A1 | 3/2007 | Kamitani et al. |
| 2007/0071423 | A1 | 3/2007 | Fantone et al. |
| 2007/0115387 | A1 | 5/2007 | Ho |
| 2007/0138920 | A1 | 6/2007 | Austin et al. |
| 2007/0146985 | A1 | 6/2007 | Mick et al. |
| 2007/0158220 | A1 | 7/2007 | Cleereman et al. |
| 2007/0226527 | A1 | 9/2007 | Ang |
| 2008/0011917 | A1 | 1/2008 | Adams |
| 2008/0164855 | A1 | 7/2008 | Tam et al. |
| 2008/0269724 | A1 | 10/2008 | Sarkinen et al. |
| 2008/0272741 | A1 | 11/2008 | Kanamori |
| 2008/0315826 | A1 | 12/2008 | Alberth et al. |
| 2008/0316687 | A1 | 12/2008 | Richardson et al. |
| 2009/0017884 | A1 | 1/2009 | Rotschild |
| 2009/0037284 | A1 | 2/2009 | Lewis et al. |
| 2009/0051223 | A1 | 2/2009 | Woo |
| 2009/0066529 | A1 | 3/2009 | Fukada |
| 2009/0115369 | A1 | 5/2009 | Lin et al. |
| 2009/0186264 | A1 | 7/2009 | Huang |
| 2009/0284216 | A1 | 11/2009 | Bessa et al. |
| 2010/0003950 | A1 | 1/2010 | Ray et al. |
| 2010/0093412 | A1 | 4/2010 | Serra et al. |
| 2010/0124040 | A1 | 5/2010 | Diebel et al. |
| 2010/0171234 | A1 | 7/2010 | Lee et al. |
| 2011/0159324 | A1 | 6/2011 | Huang et al. |
| 2012/0019057 | A9 | 1/2012 | Kirby et al. |
| 2012/0028691 | A1 | 2/2012 | Koehl |
| 2012/0088558 | A1 | 4/2012 | Song |
| 2012/0091950 | A1 | 4/2012 | Campanella et al. |
| 2012/0106037 | A1 | 5/2012 | Diebel et al. |
| 2012/0112691 | A1 | 5/2012 | Kurs et al. |
| 2012/0254479 | A1 | 10/2012 | Matsuoka |
| 2012/0303520 | A1 | 11/2012 | Huang |
| 2012/0306431 | A1 | 12/2012 | Li et al. |
| 2012/0314354 | A1 | 12/2012 | Rayner |
| 2012/0316811 | A1 | 12/2012 | Choi et al. |
| 2012/0319487 | A1 | 12/2012 | Shah |
| 2013/0038279 | A1 | 2/2013 | Seyerle et al. |
| 2013/0069583 | A1 | 3/2013 | Lemelman et al. |
| 2013/0214730 | A1 | 8/2013 | Lu et al. |
| 2013/0220841 | A1 | 8/2013 | Yang |
| 2013/0234481 | A1 | 9/2013 | Johnson |
| 2013/0262248 | A1 | 10/2013 | Kim et al. |
| 2014/0117921 | A1 | 5/2014 | Suomela |
| 2015/0111626 | A1 | 4/2015 | Bell |
| 2015/0236550 | A1 | 8/2015 | Yang et al. |
| 2015/0241931 | A1* | 8/2015 | Carnevali ............... G06F 1/181 361/679.41 |
| 2015/0364938 | A1 | 12/2015 | Lapetina et al. |
| 2016/0261133 | A1 | 9/2016 | Wang |

FOREIGN PATENT DOCUMENTS

| | | |
|---|---|---|
| WO | 9941958 A1 | 8/1999 |
| WO | 2012074151 A1 | 6/2012 |
| WO | 2012176206 A2 | 12/2012 |
| WO | 2013080068 A1 | 6/2013 |

OTHER PUBLICATIONS

Capdase CA00-C201 "PowerCup 2.2" Car Cup Holder Charger, available Dec. 2012, <http://www.amazon.in/Capdase-CA00-C201-Car-Mount-Holder/dp/B0040C5K1E> last accessed Jun 11, 2015.

Haselton "GM to Add Gadget Wireless Charging Feature to Cars in 2014", TechnoBuffalo.com, Aug. 24, 2014, <http://www.technobuffalo.com/2013/08/24/gm-wireless-charging-cars/>, last accessed Jun. 11, 2015.

Kurs et al., "Wireless Power Transfer via Strongly Coupled Magnetic Resonances", Science, Jul. 6, 2007, pp. 83-86, vol. 317.

Kuyvenhoven et al., "Development of a Foreign Object Detection and Analysis Method for Wireless Power Systems", 2011 IEEE Symposium on Product Compliance Engineering (PSES) Oct. 10, 2011-Oct. 12, 2011, San Diego, CA., pp. 1-6.

Ogg, "Wireless Power Gets Recharged", CNET Wireless Power, Jan. 5, 2007, <http://news.cnet.com/Wireless-power-gets-recharged/2100-1041_3-6147684.html> last accessed Jun. 11, 2015.

Sengupta et al., "Universally Compatible Wireless Power Using the Qi Protocol", Low Power Design, 2011, pp. 1-6, <http://lowpowerdesign.com/article_TI-Qi.html> last accessed Apr. 11, 2014.

* cited by examiner

CASE WITH ELECTRICAL MULTIPLEXING

CROSS REFERENCE TO RELATED APPLICATIONS

This application claims priority to U.S. Provisional Patent Application No. 62/289,414, filed Feb. 1, 2016, which is hereby incorporated by reference in its entirety.

FIELD

The present disclosure relates to cases, covers, and/or encasements for electronic devices. More specifically, the present application relates to cases, covers, and/or encasements having a plurality of electrical connectors for electrically connecting external devices to an electronic device installed in the case, cover, or encasement.

BACKGROUND

Portable electronic devices are commonly used for communication and entertainment purposes. Portable electronic devices include devices such as smartphones, cellular phones, mobile communication devices, computers, portable computing devices, mobile computing devices, tablet computers, cameras, video players, smart watches, audio players, electronic media readers, two-way radios, global positioning satellite (GPS) devices, and/or other types of electronic computing or communication devices, including combinations thereof. Cases, protective cases, covers, protective covers, enclosures, or encasements are sometimes used with these types of electronic devices in order to protect the devices from damage due to exposure to shock, impact, dropping, puncture, dust, dirt, water, snow, rain, mud, chemicals, and/or other potentially damaging forces or elements. The term "case" is used herein to refer to any type of case, cover, protective case, protective cover, enclosure, encasement, shell, or combination thereof. Cases are also sometimes used to supplement the functionality of an electronic device and/or to change the aesthetics of the electronic device.

Electronic devices are commonly powered by one or more internal batteries or other power sources. Batteries enable electronic devices to be used in a portable manner and/or without being tethered to a power source. These batteries are often rechargeable. Electronic devices with more features, such as larger displays and/or more computing power, typically consume the available power even more quickly. When an electronic device's battery is exhausted, the device may become unusable until the battery can be recharged or until the device can be connected to another battery or a power source, such as a wall outlet. Battery capacity for electronic devices may become an issue due to factors such as power requirements of the electronic device, extended usage of the electronic device, physical space constraints of the internal battery, power requirements of peripherals attached to the electronic device, temperature extremes, unavailability of a power source for charging, decreased battery capacity due to aging of the battery, decreased battery life due to the number of charge/discharge cycles the battery has endured, and the like, as well as combinations thereof. These factors can reduce the usefulness of the electronic device because usage of the device between recharges may be limited and the user may have to discontinue use of the device due to a depleted battery until an external power source is located.

In some situations, a user may separately carry a spare battery for the electronic device. The spare battery can be used as a replacement for a discharged battery. While carrying a spare battery enables the user to use the device again without having to find a charging source, swapping batteries has drawbacks. First, the user must remember to carry the spare battery(s), in addition to the electronic device. Second, the user must remember to keep the spare battery in a charged state in case it is needed. Third, replacing an exhausted battery, or swapping an exhausted battery out of the electronic device for charging purposes, typically requires that the device be shut down, restarted, and/or rebooted. This process is often inconvenient and typically results in temporary loss of use, communication, and/or data. Finally, when a charging source is available, the various batteries must be swapped into and out of the electronic device in order to charge them, unless a separate host-charging device is available for the extra battery.

As electronic devices become smaller and/or more complex, their external electrical interfaces may also become smaller, more complex, and/or further integrated. In some situations, manufacturers of electronic devices may include multiple functions within a single electrical interface or within a smaller number of electrical interfaces on the electronic device. In some situations, the electrical interface may be proprietary from an electrical, mechanical, and/or protocol standpoint. Newer types and styles of connectors may make it difficult for users to connect the electronic devices to legacy peripherals or external devices that do not have connectors compatible with the newer electrical interface(s) on the electronic device.

Improved cases, protective cases, covers, and/or encasements for electronic devices which solve these and other problems are desirable.

SUMMARY

In one example, a protective case for an electronic device is provided. The protective case may comprise a protective shell, a first electrical connector, a second electrical connector, and a third electrical connector. The protective shell is configured or adapted for receiving the electronic device and covering at least a portion of the electronic device when the electronic device is installed in the protective case. The protective shell includes an interior surface and an exterior surface. The first electrical connector is on the interior surface of the protective shell and is configured or adapted for electrically connecting the protective case to an electrical interface of the electronic device when the electronic device is installed in the protective case. The second electrical connector is on the exterior surface of the protective shell and is configured or adapted for electrically connecting a first external electrical device to the installed electronic device through the electrical interface of the installed electronic device. The second electrical connector is electrically connected to first electrical connector through electrical circuitry in the protective case. The third electrical connector is on the exterior surface of the protective shell and is configured or adapted for electrically connecting a second external electrical device to the installed electronic device through the electrical interface of the installed electronic device. The third electrical connector is electrically connected to first electrical connector through the electrical circuitry.

In some examples, the protective case also includes a power storage device, such as a rechargeable battery. Electrical power from the power storage device may be supplied to the installed electronic device through the first electrical connector and the electrical interface of the installed electronic device. Also, power may be supplied to the power storage device through one of the electrical connectors and the electrical circuitry.

Various other embodiments and variations of the techniques are also disclosed. While multiple embodiments are disclosed, still other embodiments will become apparent to those skilled in the art from the following detailed description and figures, which describe and show illustrative embodiments of the invention. As will be realized, the invention is capable of modifications in various aspects, all without departing from the scope of the present invention. Accordingly, the drawings and detailed description are to be regarded as illustrative in nature and not restrictive.

BRIEF DESCRIPTION OF THE DRAWINGS

Embodiments of the present invention will be described and explained through the use of the accompanying drawings in which.

DETAILED DESCRIPTION

Figure 1:
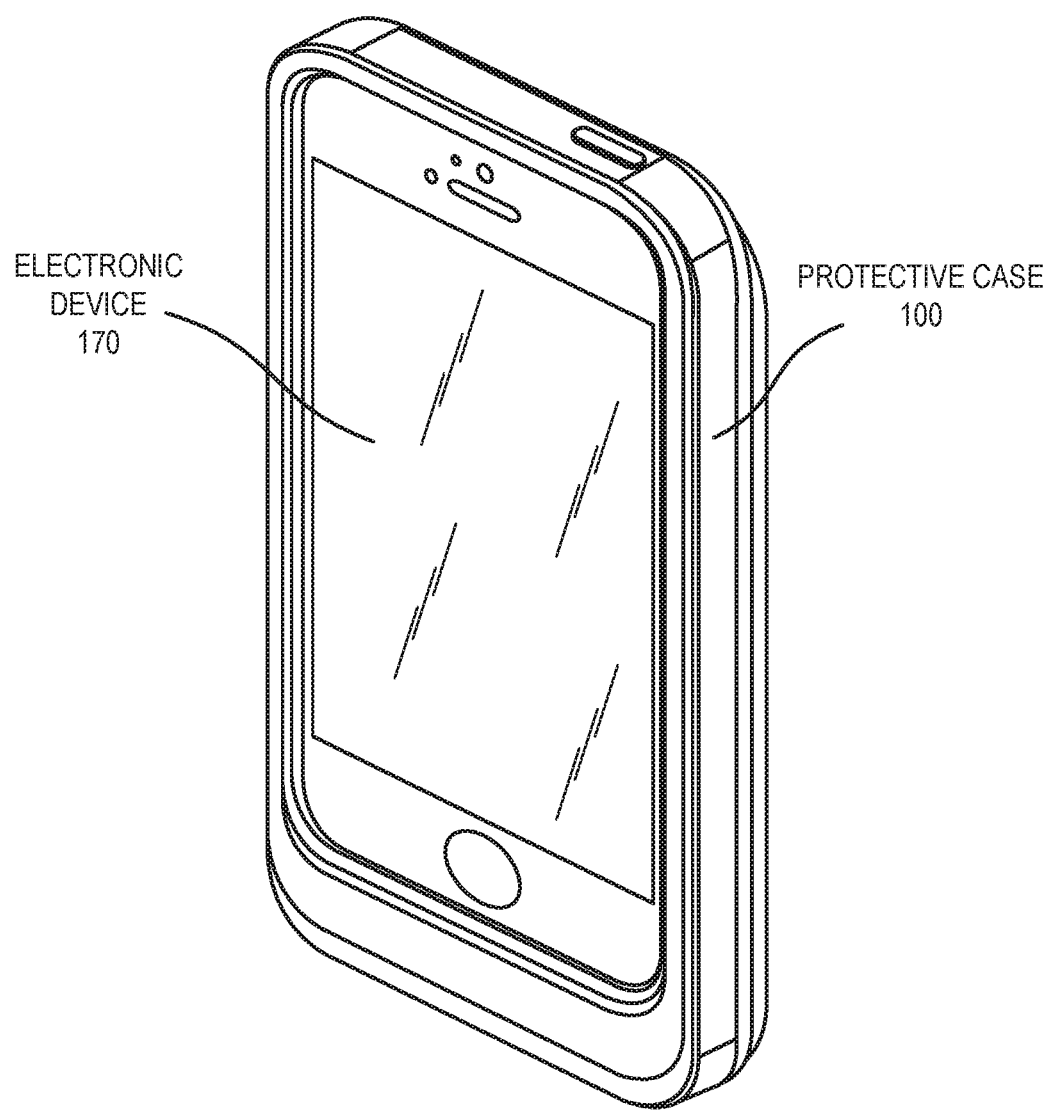
FIG. 1 illustrates a front perspective view of a protective case and an electronic device.

In the following detailed description, various specific details are set forth in order to provide an understanding of and describe the apparatuses and techniques introduced here. However, the techniques may be practiced without the specific details set forth in these examples. Various alternatives, modifications, and/or equivalents will be apparent to those skilled in the art without varying from the spirit of the introduced apparatuses and techniques. For example, while the embodiments described herein refer to particular features, the scope of this solution also includes embodiments having different combinations of features and embodiments that do not include all of the described features. Accordingly, the scope of the techniques and solutions introduced herein are intended to embrace all such alternatives, modifications, and variations as fall within the scope of the claims, together with all equivalents thereof. Therefore, the description should not be taken as limiting the scope of the invention, which is defined by the claims.

Some of the cases described herein are described as protective cases. However, the apparatuses and techniques disclosed herein are not to be limited to any particular protective characteristic of the case and may be applicable to cases, covers, or encasements that do not necessarily have protective features or characteristics.

As electronic devices become smaller and/or more complex, their electrical interfaces may also become smaller, more complex, and/or integrated a smaller number of electrical interface, such as into a single electrical or electromechanical connector. In some situations, manufacturers of electronic devices may include multiple functions within a single electrical interface on the electrical device. In some situations, the electrical interface may be proprietary from an electrical, mechanical, and/or protocol standpoint. Newer types and styles of connectors may make it difficult for users to connect the electronic devices to legacy devices or peripherals that do not have connectors compatible with the newer electrical interface(s) on the electronic device. For example, many electronic devices commonly have some combination of a power connection, a data connection, and/or an audio or headphone connection. In many situations, two or more of these connections are implemented in separate connectors or electrical interfaces on the electronic device.

In one specific example, many electronic devices have one electrical interface for power and/or data connections. Examples of these electrical interfaces includes USB connectors, mini USB connectors, micro USB connectors, APPLE LIGHTNING connectors, proprietary connectors, and/or other types of connectors. In some examples, the power connection and the data connection may include two separate electrical interfaces on the electronic device. Continuing with the example above, many electronic devices also have additional electrical interfaces for other functions. One example of this type of additional electrical interface is a headphone port or audio signal port which is separate from the power and/or data electrical interface. Additional electrical interfaces and/or types of electrical interfaces on electronic devices are possible.

As described above, it may be desirable for electronic device manufacturers to further consolidate or integrate electrical interfaces on electronic devices. This may be desirable for purposes of making the electronic device more compact, thinner, have fewer openings, be more aesthetically pleasing, improve compatibility with other devices, and/or for other reasons. In one specific example, a power/data electrical interface may be combined with a headphone electrical interface such that a new electronic device has one electrical interface that includes all or some combination of these features. This new electrical interface may have new electrical and/or mechanical characteristics that may not be compatible with legacy external devices or peripherals, such as legacy headphones or legacy chargers. In other words, a user may have a new electronic device and may wish to use existing chargers, headphones, or other external devices with the electronic device, but may be unable to do so because the electrical interface on the new electronic device is electrically and/or mechanically different than previous devices. In another example, a user may have an external credit card magnetic strip reader that makes use of a headphone port on the electronic device. When the user obtains a new electronic device that does not have the legacy headphone port, the user may use one of the cases disclosed herein in order to continue using his or her existing credit card magnetic strip reader with the electronic device.

The cases disclosed herein resolve this and other problems by providing an electrical connector on an inside surface of the case that interfaces with the electronic device and branches, splits, separates, and/or demultiplexes the signals from the single electrical connector out to two or more electrical connectors on an outside surface of the case. The electrical connectors on the outside of the case may be compatible with legacy or prior external devices. Described in the opposite direction, signals from the two or more electrical connectors on the outside of the case may be combined, joined, and/or multiplexed together and routed to the single electrical interface on the inside of the case that is compatible with and interfaces with the installed electronic device. Even though an electronic device may include a new type of connector with integrated functions, the case enables the user to still make use of his or her legacy peripherals, devices, or accessories.

Some existing cases for electronic devices also include supplemental power devices or power sources for supplying power from the case to the electronic device. Supplemental power is often provided by one or more rechargeable batteries included in the case. While many of the examples herein are discussed in the context of single batteries or power sources, it should be understood that the techniques, apparatuses, systems, and methods disclosed herein are also applicable to configurations in which more than one power source in the electronic device is used and/or more than one supplemental power source in the case is used. Cases having batteries as supplemental power sources are sometimes generally referred to herein as "battery cases" or "power cases." The term "battery" is used broadly herein to refer to any type of electrical and/or chemical energy storage device. A battery or energy storage device may include one or more: rechargeable batteries, fuel cells, capacitors, supercapacitors, alkaline batteries, carbon-zinc batteries, nickel-metal hydride batteries, lithium batteries, lithium ion batteries, lithium titanate cells, and/or lithium polymer batteries. A battery or energy storage device may be a single device or can be a plurality of devices. The improved cases disclosed herein may or may not be battery cases and may or may not include supplemental power sources as described in further details below.

While many of the examples herein are described with respect the mobile phones or smartphones, the apparatuses, techniques, and methods described herein are equally applicable to other types of electronic devices, such as smart watches, and are not to be limited to mobile phones. Furthermore, various examples provided herein discuss the providing, transfer, or delivery of power from one device to another. Other examples discuss the providing, provision, transfer, or delivery of current from one device to another. It should be understood that no functional distinction is made in the apparatuses, techniques, and methods disclosed herein with respect to delivering power or delivering current as the amount of power provided, transferred, and/or delivered at a known voltage can be mathematically determined based on the amount of current provided, transferred, and/or delivered.

FIG. 1 illustrates a front perspective view of a protective case 100 for an electronic device 170 in accordance with the techniques and improvements introduced herein.

Electronic device 170 may be a cellular phone, smartphone, mobile communication device, mobile computing device, portable computing device, tablet, phablet (phone/tablet), portable computer, personal video player, electronic media reader, audio player, handheld scanner, camera, GPS device, or electronic computing or communication device of another type, including combinations thereof. In one specific example, electronic device 170 may be an APPLE IPHONE. In another specific example, electronic device 170 may be a SAMSUNG GALAXY phone.

Protective case 100 comprises any type of protective shell, cover, covering, enclosure, bumper, sheath, encasement, member, and/or a combination thereof used with the electronic device 170. Protective case 100 may provide protection against forces or damaging elements such as shock, impact, dropping, puncture, dust, dirt, heat, cold, water, snow, rain, mud, fluids, chemicals, and/or other potentially damaging elements. In various instances, as described in further detail below, protective case 100 may be waterproof, watertight, and/or water-resistant. In other examples, techniques disclosed herein may implemented in the form of a cover for electronic device 170 which provides some or all of the functions disclosed herein while having little or no protective characteristics.

Protective case 100 may encase or cover electronic device 170 partially or fully. For example, in various configurations, protective case 100 may attach, contact, or interface to only a single surface of electronic device 170 or may attach, contact, or interface with a plurality of surfaces of electronic device 170. In some configurations, protective case 100 may include a membrane positioned over an interactive control panel or a touch screen interface of electronic device 170 such that inputs provided by a user on an outside surface of the membrane can be detected by electronic device 170 through the membrane. In some configurations, a membrane may not be present. However, as described in further detail below, even in instances where a membrane is not present, protective case 100 may still be waterproof or water-resistant when electronic device 170 is installed. This may be accomplished using one or more gaskets, seals, sealing surfaces, and/or o-rings that seal or form a seal between protective case 100 and a surface of electronic device 170, such as at a perimeter of the touchscreen or the housing of electronic device 170. Such sealing may enable a remaining portion of electronic device 170 to be protected in a waterproof or water-resistant manner even though a portion of electronic device 170, such as the touchscreen, is directly exposed.

Protective case 100 may include one member, two member, or more members to form a shell. Some of these members may be permanently attached to each other and some of these members may be removably attachable to each other for insertion and/or removal of electronic device 170 from protective case 100. In some situations, protective case 100 may be a one-piece case or a one-piece assembly into which electronic device 170 snaps or slides. Protective case 100 may also include one or more cushion members, cushion layers, and/or cushion portions that are removably attached or permanently attached to any combination of the one, two, or more members. Any portion of protective case 100 may be made of any suitable material, including, but not limited to, polycarbonate (PC), high impact polystyrene (HIPS), nylon, fiberglass-filled nylon, acrylonitrile butadiene styrene (ABS), polyoxymethylene (POM), polyethylene terephthalate (PET), ceramic, metallized ceramic, aluminum, aluminum alloy, titanium, wood, carbon fiber, and/or any combination thereof. The techniques disclosed herein are not to be limited to any particular type, structure, or configuration of the shell or case.

In various instances, protective case 100 may include a supplemental power source (internal to protective case 100 and not visible in FIG. 1) that is capable of providing electrical power to electronic device 170. The term 'supplemental' power source is used in various instances to indicate that the protective case makes additional power available to electronic device 170 rather than the power being 'supplemental' relative to protective case 100 itself. In some configurations, protective case 100 includes an internal electrical, mechanical, and/or electromechanical interface (not visible in FIG. 1) for conducting the electrical power from the supplemental power source of protective case 100 to the installed electronic device 170.

Figure 2:
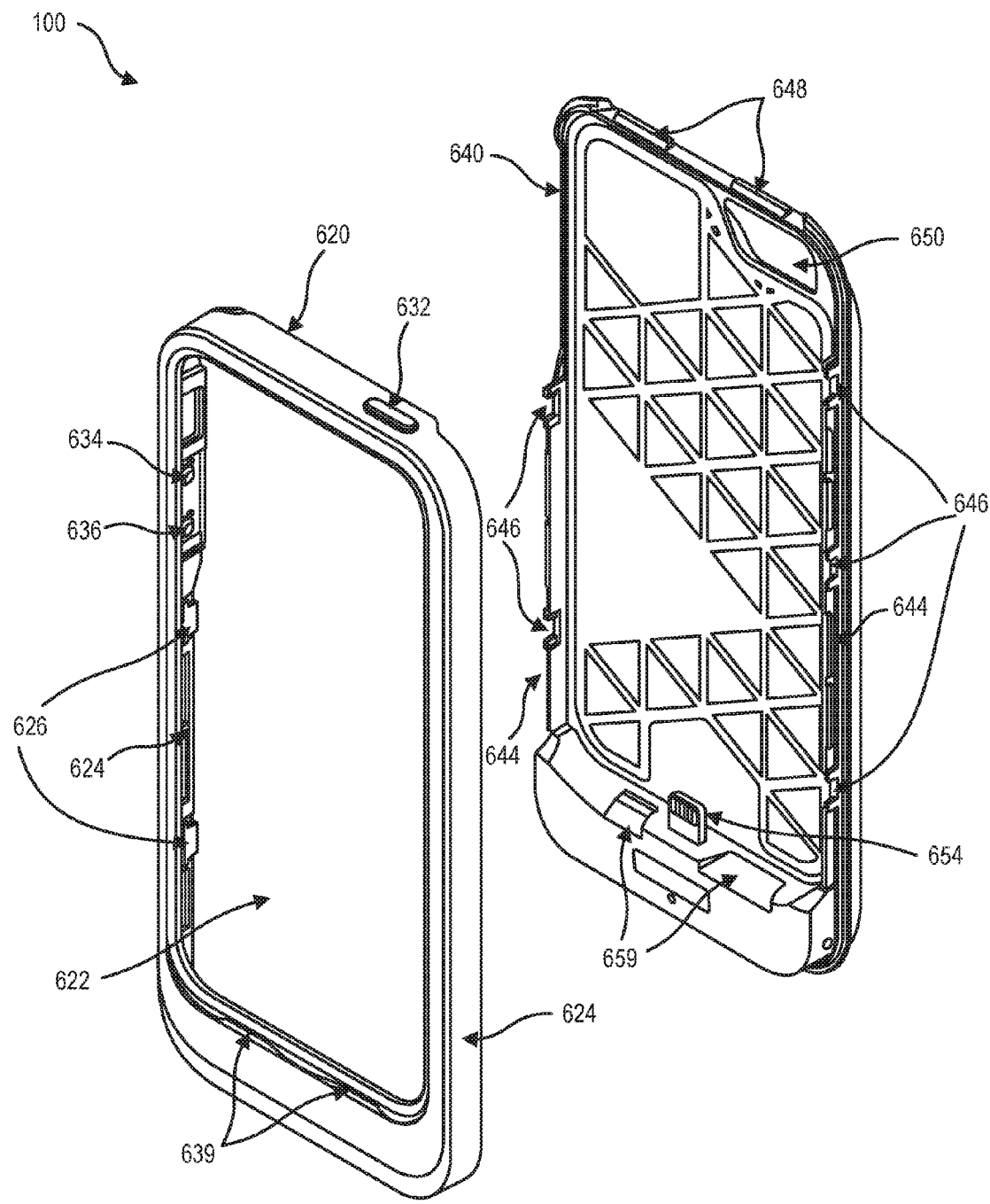
FIG. 2 illustrates a front exploded perspective view of a protective case.

FIG. 2 illustrates a front exploded view of protective case 100. Protective case 100 includes a front member 620 and a back member 640. Front member 620 includes a front surface and sides, such as side 624, which engage back member 640 to form a cavity into which an electronic device, such as electronic device 170, may be placed. Front member 620 and back member 640 may partially or fully receive, encase, or enclose the electronic device.

Front member 620 can be made of any suitable material, including, but not limited to, polycarbonate (PC), high impact polystyrene (HIPS), nylon, fiberglass-filled nylon, acrylonitrile butadiene styrene (ABS), polyoxymethylene (POM), polyethylene terephthalate (PET), ceramic, metallized ceramic, aluminum, aluminum alloy, titanium, wood, carbon fiber, and/or any combination thereof.

Some or all of the features of the electronic device may be accessible or usable while the electronic device is in protective case 100. Front member 620 includes opening 622 in the front surface of front member 620 for accessing the installed electronic device. In one example, the electronic device may have a touchscreen display and the user may directly access the touchscreen display of the electronic device through opening 622 of front member 620 when the electronic device is in protective case 100. Opening 622 may or may not be covered by a membrane, film, or skin (not shown). When no membrane, film, or skin is present, the user is able to directly touch the touchscreen display through opening 622. If a membrane, film, or skin is included, it may be sufficiently thin and sufficiently optically transparent to allow the user to operate the touchscreen through the membrane in a manner similar to how the device would be operated if the membrane, skin, or film was not present and the user was touching the device directly. In other words, the membrane, film, or skin may have little or no effect on the operation of the touchscreen by the user. The membrane, skin, or film may be included for purposes of protecting the display of the electronic device. In some situations, the membrane, skin, or film may be attached to or adhered to the electronic device rather than to front member 620. Alternatively or in addition to protecting the touchscreen from scratches or impact, the membrane, skin, or film may be included for sealing the protective case against elements such as, for example, dirt, water, snow, dust, or chemicals.

The membrane, film, or skin can be made of any suitable material that permits the user to interact with the display screen of the electronic device through the membrane. In one example, the membrane can be made from a thin layer of thermoplastic polycarbonate (e.g. LEXAN), polyvinylchloride, high-strength alkali-aluminosilicate thin sheet glass (e.g. GORILLA GLASS), urethane, silicon, polyethylene terephthalate (PET), or any other suitable material. The membrane can be formed using any suitable manufacturing process, such as thermoforming, casting, stretching, heating, or injection molding. In one example, the membrane can include a thin, transparent, flexible layer of polyurethane, which can serve as a clear screen protector with desirable optical qualities (e.g. high transparency and low reflectivity). The membrane can have any suitable thickness. In one example, the membrane can have a thickness of about 0.001-0.100, 0.001-0.050, 0.004-0.020, 0.005-0.015, or 0.005-0.010 inches. The membrane can also have a micro-textured surface to reduce glare. The membrane can include an oleophobic surface coating on its outer surface to minimize the appearance of fingerprints or oily smudges on the membrane, thereby allowing the screen of the electronic device to be clearly viewed through the membrane while reducing the possibility of unwanted obstructions.

Front member 620 may also include one or more other apertures or openings for accessing the electronic device. For example, an opening may enable a user to access a switch or control on a side of the electronic device when the electronic device is in protective case 100. One or more openings or apertures may exist on any side or surface of front member 620 or back member 640 for accessing a switch, control, or feature of the electronic device. In various instances, one or more of the apertures or openings may be covered, such as with a flexible or semi-flexible material, such as TPE, so as to make the aperture watertight while still allowing access and/or control of the one or more control features of the encased electronic device.

In some instances, in addition to apertures or openings, front member 620 and/or back member 640 may include one or more button features, such as button features 632, 634, and 636. These features enable a user to operate a button or control of the electronic device inside the protective cover without directly contacting the electronic device. The button features may be implemented using a variety of devices or structures.

In one example, button feature 632 is configured to engage a power switch of an electronic device. The button feature may be used to engage other types of switches of the electronic device. Button feature 632 may be designed to flex inward with respect to front member 620 and toward the inside of front member 620 when a user applies force to an outer surface of button feature 632, thereby permitting actuation of the power switch of the electronic device. Button feature 632 may be flexibly coupled to front member 620 by a flexible hinge or beam. In some configurations, the flexible hinge may be formed using a different material than the primary material used to form front member 620. During manufacturing, thin gates can be formed to permit flow of the second material to the area around button feature 632. The thin gates may be easily be broken by actuating button feature 632 during a first use. As a result, button feature 632 decouples entirely from front member 620 and stays attached to the second material, where it can easily be actuated by the user. Other methods of manufacture and other methods of flexibly attaching button feature 632 to front member 620 are possible. For example in other configurations, button feature 632 may be formed from a same material as front member 620.

In contrast to button feature 632, button features 634 and 636 may be movable to engage a button or control feature of the electronic device inside protective case 100 without being attached to front member 620 in a fixed manner. For example, button feature 634 and/or button feature 636 may be a separate piece which is captured within constraint features of front member 620 such that the button feature freely moves relative to front member 620, within a range of movement. In other words, button features 634 and 636 may be loosely coupled to front member 620 to allow it to move enough relative to 620 to engage a button, switch, or control feature of an electronic device inside protective case 100. This configuration permits the button feature to move or be actuated with respect to front member 620 while still being contained by front member 620.

Button features 634 and 636 may be manufactured as a separate piece from front member 620 and have an interference fit with respect to an opening in front member 620 such that they are initially snapped or pushed into place with sufficient force to overcome the force of the constraint feature and stay constrained after being pushed or forced into place. Alternately, as discussed above with respect to button feature 632, button feature 634 and/or 636 may be formed as part of front member 620 with thin gates, which are broken upon initial use or post molding processing and stay loosely coupled to protective case 100 within a range of movement afterward.

Back member 640 comprises an inner surface and one or more sides, such as sides 644. Back member 640 couples with front member 620 to partially or fully capture, contain, encase, or enclose the electronic device. When inside protective case 100, the electronic device rests against the inner surface. Back member 640 may be made of any suitable material, including, but not limited to, polycarbonate (PC), high impact polystyrene (HIPS), nylon, fiberglass-filled nylon, acrylonitrile butadiene styrene (ABS), polyoxymethylene (POM), polyethylene terephthalate (PET), ceramic, metallized ceramic, aluminum, aluminum alloy, titanium, wood, carbon fiber, and/or any combination thereof.

The inner surface may also include one or more portions of a soft, compliant, cushioning, or compressible material to further protect the electronic device from shock, scratching, impact, and/or vibration. The material may also reduce movement and/or rattling of the electronic device inside protective case 100 by applying a force to the electronic device inside protective case 100 in response to being compressed when the electronic device is installed. The soft, compliant, cushioning, or compressible material may comprise a single piece or multiple pieces and may or may not be adhered to back member 640. In some configurations, a closed cell or open cell foam material may be used. In other configurations, other compliant materials such as rubber, TPE, silicone, or the like may be used. Soft, compliant, or compressible materials may be attached to front member 620 in addition to or in place of back member 640 for similar purposes. In some instances, one or more of these materials may be molded to, molded with, or comolded with one or more portions of the case, such as in a single shot or double shot molding process.

Front member 620 and back member 640 may be formed from materials having a same color or may be formed from materials having different colors to produce a contrast effect. In addition, one or more of front member 620 and back member 640 may receive a surface treatment to provide a different texture or feel to the surface. In one example, one or more of front member 620 and back member 640 may be transparent, may be semi-transparent, may have transparent portions, or may be painted or coated with a soft touch paint to provide a soft, velvety, leathery, and/or rubbery feel. The types of treatments, finishes, or coatings may give the components increased grip, improved durability, improved scratch resistance, improved resilience to fingerprints, and/or other characteristics. In another example, front member 620 and/or back member 640 may include metallic components, may be coated with a metallic material, or may include metallic particles for altering, changing, improving, and/or re-directing electromagnetic signal transmission or reception between the electronic device and an external device.

In some situations, back member 640 may also contain one or more electrical components for implementing power-related functions. For example, back member 640 may contain one or more of a battery, a supplemental power source, electrical components, electronic components, electromechanical components, a computer processor, and/or printed circuit boards for implementing electrical, electronic, and/or power features. Back member 640 may comprise two or more structural components that are permanently or semi-permanently attached to each other during a manufacturing or assembly process to contain or enclose any of the power, electrical, electronic, or electromechanical components described herein in a cavity of back member 640. In some configurations, the electrical and/or electronic components may be permanently or semi-permanently enclosed in a cavity such that they are not visible, not accessible, protected, and/or not easily accessible to a user.

Back member 640 may also contain an electrical connector, such as electrical connector 654, for interfacing to an installed electronic device. In one example, electrical connector 654 may be an APPLE LIGHTNING connector. In another example, electrical connector 654 may be USB connector, a mini USB connector, a micro USB connector, a USB type C connector, another variety of USB connector, a cylindrical connector, and/or a proprietary connector. When an electronic device is inserted into back member 640, electrical connector 654 may electromechanically interface with an electrical interface or connector of the electronic device. When electronic device 170 is inserted or installed in protective case 100, electronic device 170 is held in place as to stay engaged with electrical connector 654.

In addition to transmitting power to the electronic device, electrical connector 654 may be used to transmit data to the electronic device, receive data from the electronic device, transmit messages to the electronic device, receive messages from the electronic device, transmit control signals to the electronic device, and/or receive control signals from the electronic device. Electrical connector 654 may be used, among other functions, to provide electrical power to the electronic device from a battery contained inside protective case 100 and/or from a power source or power supply external to protective case 100. Further, electrical connector 654 may contain circuitry or electrical components, other than electrical conductors, such as passive analog components, active analog components, passive digital components, and/or active digital components. Electrical connector 654 may be attached to protective case 100 in a fixed manner, may pivot in one or more axes, or may be attached to a flexible cable that allows it to be attached to electronic device 170 before electronic device 170 is fully inserted into protective case 100.

Although the various electrical and electronic features and functions disclosed herein are primarily described as being included in back member 640, some or all of the electrical components, including electrical connector 654, may be contained in front member 620. In another variation, the electrical components and/or features may be distributed among front member 620 and back member 640. In addition, one or more electrical interconnections may exist between front member 620 and back member 640. It should be understood that any of the features, functions, or characteristics of protective case 100 may be implemented as a single piece case, sometimes also referred to as a one piece case, or may be implemented in a case having two or more structural or shell members.

Back member 640 may also contain one or more button features, such as button features 632, 634, and/or 636, depending on where buttons or control features are located on electronic device 170. Variations of protective case 100 may have button features, openings, and/or other features in various locations on front member 620 and/or back member 640 to correspond to locations of buttons, switches, control features, ports, cameras, displays, and/or other interfaces on a particular model of electronic device.

Front member 620 and/or back member 640 may also contain other types of openings, such as opening 650, for a camera, camera flash, and/or related features of electronic device 170. Opening 650 allows the camera, camera, flash, and/or related features of the electronic device to still be used even though the electronic device is enclosed within protective case 100. Opening 650 may be an open aperture between the inside and outside of protective case 100 or may be covered with an optically transparent, or nearly optically transparent, membrane, film, or lens that further protects the electronic device while permitting the camera, camera flash, and/or related features to remain usable. Openings may exist in other locations on back member 640 and/or front member 620, to accommodate other features of the electronic device. Any of the openings described herein may be covered with a membrane or other material, such as polytetrafluoroethylene (PTFE), to make the case water-resistant or waterproof with respect to that opening.

Protective case 100 may also include a camera flash isolator (not pictured). When the electronic device is installed in the protective case 100, the camera flash isolator can be located between a camera and a flash on a back side surface of the electronic device. In one example, the camera flash isolator can include a foam layer adhered to the inner surface of back member 640. The foam layer can provide a light barrier between the camera and the flash and can extend from a back side surface of the electronic device. When a user takes a flash photo with the electronic device, the camera flash isolator can prevent light emitted from the flash from reflecting off of the inner surfaces of protective case 100 toward the camera, where the reflected light could result in unwanted optical artifacts, aberrations, and/or blurriness in the image captured by the electronic device.

Front member 620 and/or back member 640 may also contain features for channeling, routing, guiding, and/or directing audio to/from the electronic device when it is inside protective case 100. In one example, the electronic device may have a speaker and/or microphone along its bottom edge. Back member 640 contains reliefs 659 that allow audio to/from the microphone/speaker to be routed toward the front of back member rather than being blocked by the a seating surface of back member 640 where the bottom of the electronic device rests. Reliefs 659 align with openings 639 of front member 620 when front member 620 is attached to back member 640. Beneficially, audio is effectively routed to/from the front of protective case 100 from/to the electronic device even though the electronic device is partially or completely enclosed by protective case 100. It should be understood that many other configurations are possible for accomplishing similar audio effects and the configuration may vary depending on the location of audio features on the electronic device.

Front member 620 includes clasping features 626 along sides 624 for engaging clasping features 646 along sides 644 of back member 640. Clasping features 626 engage and/or mate with clasping features 646 to attach front member 620 to back member 640. The clasping features hold front member 620 and back member 640 together until sufficient force is applied to overcome the clasping features and non-destructively pull them apart. Clasping features 624 and 646 may include any kind of clip, snap, fastener, latch, tab, cantilever snap joint, cantilever hook, compressive hook, torsion snap joint, annular snap joint, cylindrical snap joint, bayonet finger, trap, ball and socket, lip, groove, finger, detent, and/or other permanent or semi-permanent retention mechanism for holding front member 620 and back member 640 together. It is desirable to have clasping features 626 and/or 646 within the outer surface of front member 620 and/or back member 640 such that protective case 100 has a smooth, or nearly smooth, outer surface that can be easily slid into a pocket, does not catch on clothing, and/or does not easily scratch other items. A user may periodically desire to detach front member 620 from back member 640 to remove electronic device 170 from protective case 100.

While particular numbers, locations, and types of clasping mechanisms may be illustrated in the figures, any number, location, or type of clasping mechanisms may be placed along the perimeters of front member 620 and back member 640. Clasping mechanisms may also be present on the top and/or bottom edges of front member 620 and/or back member 640. Many other clasping mechanism positions, orientations, combinations, and/or configurations are possible.

A gasket, o-ring, seal, and/or other sealing feature may also be used between front member 620 and back member 640 to make protective case 100 water-resistant or waterproof. A seal, gasket, sealing surface, and/or o-ring may extend around a perimeter of one or more of front member 620 and back member 640 and be compressed when front member 620 and back member 640 are attached together. Attachment of the clasping mechanisms may maintain a compressive force on the gasket to achieve or improve the sealing effect.

In some instances, a seal or gasket may be a molded-in or comolded feature. In some configurations, one or both of front member 620 and back member 640 may contain an overmolded gasket. The overmolded gasket may be made of a thermoplastic elastomer. In one example, a front member can include a mating surface configured to mate against the overmolded gasket when a back member is attached to the front member. The seal formed between the overmolded gasket and the mating surface can be a water-resistant or water-proof seal. During assembly, the mating surface can provide a compressive force against the overmolded gasket thereby compressing the overmolded gasket to create the seal. In some configurations, the overmolded gasket may include a groove located between the flexible sealing surface and an inner gasket portion. The groove can permit flexing of the flexible sealing surface during assembly to provide a water-resistant or water-proof seal between the flexible sealing surface and the sealing surface. In some configurations, the inner gasket portion may not seal against the sealing surface of the front portion. Instead, the inner gasket portion may improve manufacturability of the overmolded gasket. The inner gasket portion can also enhance adhesion between the overmolded gasket and the inner back surface of the back portion due to the greater contact area between the overmolded gasket and the inner back surface. Consequently, the inner gasket portion may enhance durability and longevity of the overmolded gasket. In some situations, a formed-in-place gasket may be created on one or more portions of the case.

In the case of water-resistant or water-proof applications, one or more of the openings or apertures discussed herein may be covered with a material that allows sound and/or air to pass between the outside of protective case 100 and the inside of protective case 100 while maintaining the water-resistant or water-proof characteristics of the case (e.g., GORE-TEX).

In addition, one or more of the openings or apertures discussed herein may be covered with a plug, port cover, door, and/or bung to protect against water, snow, dust, or other elements when the aperture or opening is not in use. In one example, the port cover can be configured to cover and seal an opening in either the front member or the back member. The port cover may include a gasket or o-ring configured to seal against a surface of the opening to provide a water-resistant or water-proof seal when the port cover is in a closed position. When in an open position, the port cover can provide access to features of the personal electronic device through the opening. In one example, the port cover can be attached to the case by inserting a feature of the port cover into a slot in the front or back member. The port cover can include a hinge to permit flexing of the first port cover during opening and closing. In one example, the hinge can be a portion of the port cover having a relatively thinner cross-sectional area than adjacent portions of the port cover allowing it to flex away from the port opening. The port cover may be inserted into the opening by pressing it into the opening. The port cover may stay in place as a result of a snug fit with the opening or an interference opening. In another example, the port cover may be a bung that is threaded into either the front member or the back member to cover an opening. The opening and the bung may have a gasket and seating surface that meet to seal the opening when the bung is screwed into place. The bung may also contain a tether to the protective case or to a cable or adapter such that the bung is not misplaced when not in use.

In some configurations, one or more of front member 620 and/or back member 640 may each include a first layer and a second layer. In one example, the second layer can be overmolded onto the first layer. The first layer can be made of a relatively hard material and the second layer can be a relatively soft material. The first layer can be made of any suitable material, including, but not limited to, polycarbonate (PC), high impact polystyrene (HIPS), nylon, fiberglass-filled nylon, acrylonitrile butadiene styrene (ABS), polyoxymethylene (POM), polyethylene terephthalate (PET), ceramic, metalized ceramic, aluminum, aluminum alloy, titanium, wood, carbon fiber, or any combination thereof. The second layer can be made of any suitable material, such as a thermoplastic elastomer. The first layer can bolster the structural rigidity of the case to enable the case to withstand a moderate drop without experiencing significant physical deformation upon impact, thereby ensuring that unwanted separation of the front member and the back member does not occur at impact. Separation is undesirable, since the electronic device will typically exit the cavity of the case and then be unprotected and vulnerable to scratching, shattering, or water damage as it makes direct contact with the ground or water.

The second layer can be made of a relatively soft but durable material that dampens, absorbs, and/or dissipates impact energy associated with a moderate drop, thereby reducing the magnitude of shock or impact forces transmitted to the electronic device housed inside the protective case at a moment of impact and/or shortly thereafter.

Front member 620 and/or back member 640 can include a plurality of relatively soft protrusions on their inner surfaces. The protrusions can improve the fit of the electronic device within the cavity. For example, respective protrusions can compress toward the inner surfaces of the cavity when the electronic device is installed in the cavity, thereby taking up any gap between the device and the inner surfaces of the cavity. This approach may permit the cavity to be manufactured with a tolerance that is less restrictive than a tolerance that would be required if the cavity were required to fit snugly around the electronic device. This approach may also reduce manufacturing costs since a higher percentage of manufactured components may meet design specifications, thereby reducing the number of rejected parts and/or reducing waste in the manufacturing process(es).

In addition to manufacturing considerations, the protrusions may isolate the electronic device from the inner surfaces of the cavity. As a result, an air gap is provided around the side surfaces of the electronic device. The air gap may prevent impact forces from being transmitted directly from the first layer to the electronic device. The air gap may also prevent side surfaces of the electronic device from becoming marred as a result of frequent contact and minor positional shifting relative to the harder and less forgiving surfaces of the cavity. Consequently, degradation of the exterior surface of the electronic device over time is reduced. In addition, the protrusions may reduce the tendency for vibrations or movement to occur between the electronic device and hard surfaces of the case such as, for example, form handling of the device or when audio is being produced by a speaker of the electronic device.

It should be understood that many of the features of protective case 100 illustrated in FIG. 2 are optional and that the techniques disclosed herein may be implemented in many different types of cases, protective cases, covers, protective covers, encasements, and/or protective encasements.

Figure 3:
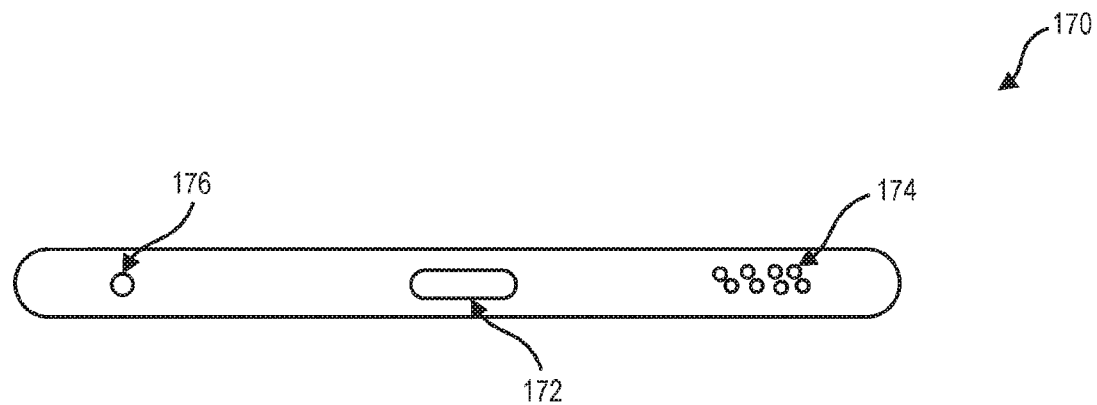
FIG. 3 illustrates a bottom view of an electronic device.

FIG. 3 illustrates a bottom view of electronic device 170. Electronic device 170 includes an electrical interface 172 for interfacing or electrically connecting with electrical connector 654 when electronic device 170 is inserted into protective case 100. Electrical interface 172 may include a USB connector, a mini USB connector, a micro USB connector, a USB type C connector, an APPLE LIGHTNING connector, a proprietary connector, and/or another type of connector. Electrical interface 172 may be located on any surface or side of electronic device 170. Electronic device 170 may also include other features, such as microphone 176 and speaker 174. These other features may also be located on any other surface or side of electronic device 170.

Figure 4:
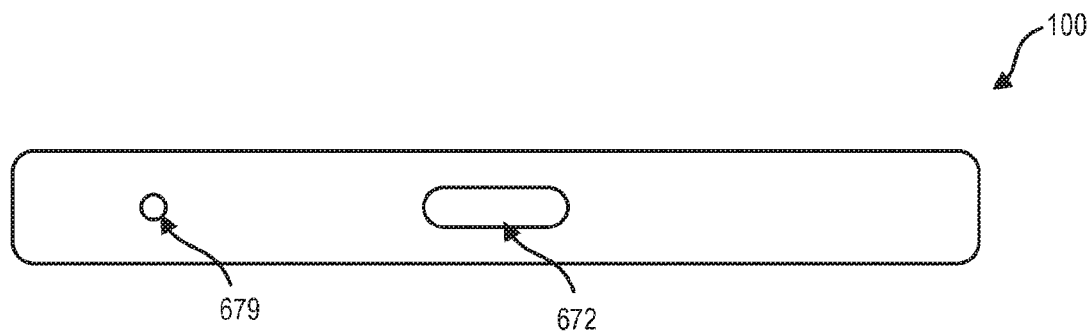
FIG. 4 illustrates a bottom view of a protective case.

FIG. 4 illustrates a bottom view of protective case 100. Protective case 100 includes electrical connector 672. Electrical connector 672 may include a USB connector, a mini USB connector, a micro USB connector, an APPLE LIGHTNING connector, a proprietary connector, and/or another type of connector. Electrical connector 672 may be located on any exterior surface or side of protective case 100. Protective case 100 also includes another electrical connector, electrical connector 679. Electrical connector 679 may be a headphone jack, a headphone connector, a connector for another type of device, a 2.5 mm connector, a 3.5 mm connector, a proprietary connector, and/or an electromechanical connector of another type. Electrical connector 679 may be located on any exterior surface or side of protective case 100.

Figure 5:
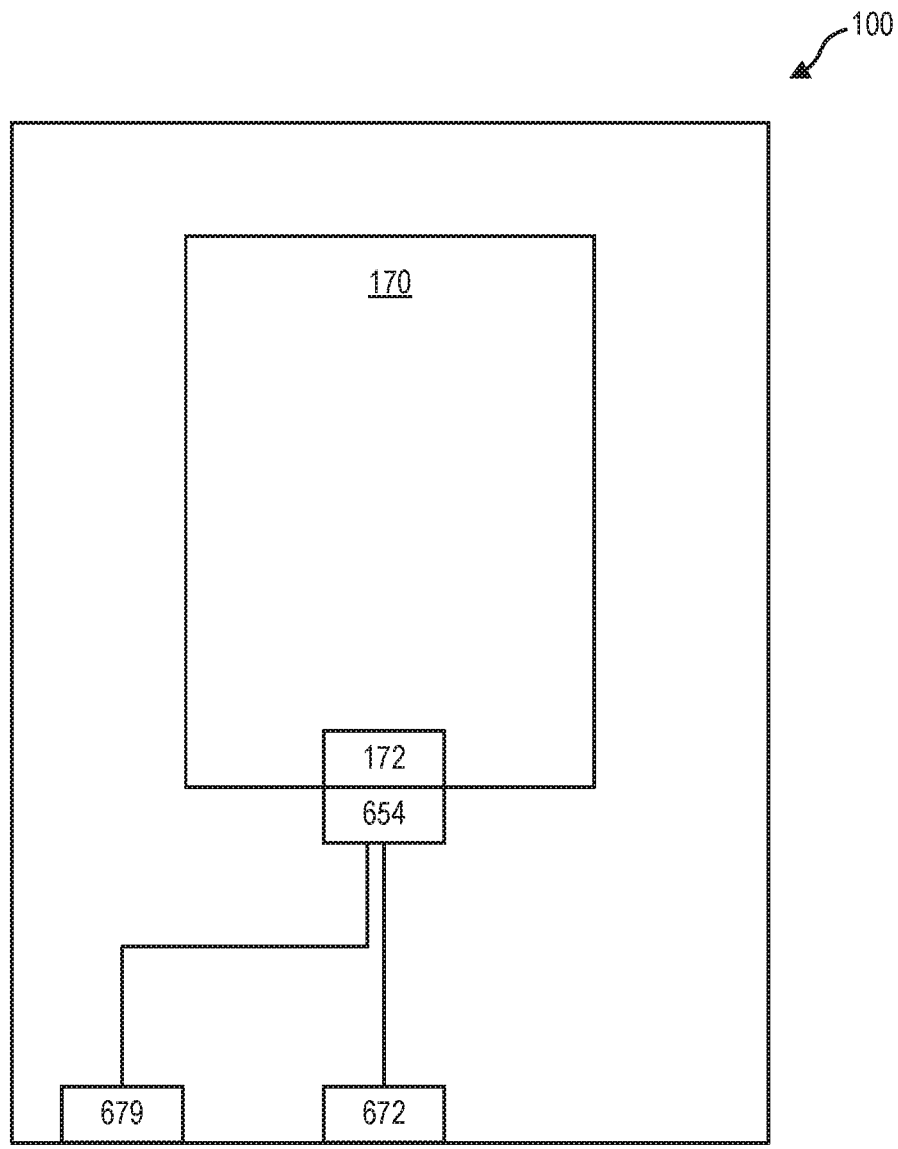
FIG. 5 illustrates a block diagram of a protective case.

FIG. 5 illustrates a block diagram of electrical features of protective case 100 with electronic device 170 installed. FIG. 5 illustrates these elements in a functional manner rather than illustrating the actual physical appearance of these elements. When electronic device 170 is inserted into or installed into protective case 100, electrical interface 172 of electronic device 170 mates, engages, connects, electrically connects, and/or electrically interconnects with electrical connector 654 of protective case 100 such that electrical signals and/or power from electronic device 170 may be conducted or transferred between electronic device 170 and electrical connector 654.

As illustrated in FIG. 5, electrical connector 654 is electrically connected to both electrical connector 672 and electrical connector 679 of protective case 100. Electrical connector 672 and/or 679 may be located or accessible at an external surface of protective case 100. Some of the electrical signals conducted through electrical connector 654 from electronic device 170 are routed or conducted to electrical connector 672, while other of the electrical signals are routed or conducted to electrical connector 679. It should be understood that the techniques disclosed herein are also applicable in configurations in which there are additional quantities and/or types of electrical connectors and/or interfaces.

Cases implemented using the techniques disclosed herein enable a user to utilize legacy devices or peripherals that may be compatible with electrical connector 672 and/or electrical connector 679, even though electronic device 170 may include a new type of interface, such as electrical interface 172, that is not compatible (electrically, mechanically, or both) with those legacy devices. Protective case 100 also enables these legacy devices to be used with an electronic device 170 in which signals associated with multiple legacy connectors or interfaces have been combined into a single connector or interface. In one example, electrical interface 172 may contain both signals related to charging of electronic device 170 as well as audio signals. The power related signals may be routed to electrical connector 672 while the audio signals are routed to electrical connector 679. In another example, electrical interface 172 may contain both data communication signals as well as audio signals. The data communication signals may be routed to electrical connector 672 while the audio signals are routed to electrical connector 679. Other combinations of signal types and routing are possible.

While many of the examples herein are discussed with respect to power, data, or electrical signals being sent to or from one device or another, it should be understood that the techniques herein are equally applicable in situations where the power, data, or electrical signals are being sent in the other direction and/or in both directions. The techniques include any combination of unidirectional and bidirectional signals. In one specific example, protective case 100 may enable a user to continue to utilize a legacy charger and legacy headphones with an electronic device 170 in which those previously separate interfaces have been combined into a single electrical interface that is mechanically and/or electrically incompatible with the legacy devices.

Figure 6:
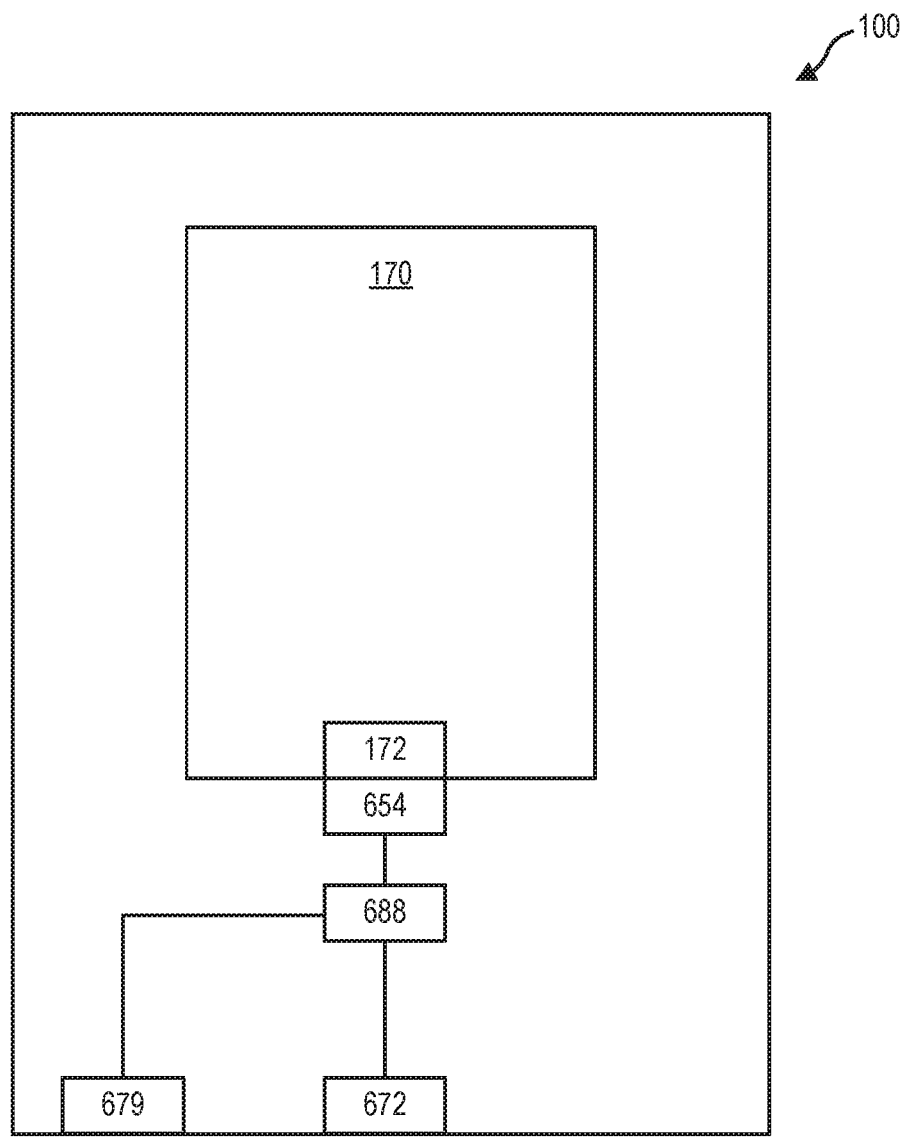
FIG. 6 illustrates a block diagram of a protective case.

FIG. 6 illustrates a block diagram of protective case 100 with electronic device 170 installed. Relative to FIG. 5, FIG. 6 further includes electrical circuitry 688. Electrical circuitry 688 may include any combination of discrete components, integrated circuits, electrical conductors, passive analog components, active analog components, passive digital components, active digital components, programmable devices, a printed circuit board, a microcontroller, programmable logic, and/or a computer processor. FIG. 5 illustrates signals conducted to/from electrical connectors 672 and 679 being conducted directly from electrical connector 654 through electrical conductors without any other modification. While this may be suitable in some situations, in other situations the combining of two or more legacy interfaces into a new interface may necessitate electrical, protocol, or format changes to the signals in addition to the mechanical reconfiguration of the connectors.

In the example of FIG. 6, some or all of the signals are processed through electrical circuitry 688 before being conducted or transmitted between electrical connector 654 and electrical connectors 672 and 679. Electrical circuitry 688 may perform one or more of many modifications or adjustments to one or more of the signals including: signal conditioning, voltage step up, voltage step down, voltage scaling, threshold limiting, amplification, biasing, and/or filtering. In addition, electrical circuitry 688 may change the formatting, protocol, and/or configuration of any one or more of the signals. In addition, electrical circuitry 688 may combine, separate, multiplex, demultiplex, modulate, demodulate, interlace, interleave, reorder, encode, decode, change the timing of, change the sequence of, and/or authenticate any of the signals or combinations of the signals to convert the signals between a format/protocol associated with electrical connector 654 and a format/protocol associated with electrical connector 672 and/or electrical connector 679. In other words, electrical circuitry 688 translates, transforms, or converts, the signals between a format associated with electrical connector 654 and one or more formats associated with electrical connector 672 and/or 679 such that devices or peripherals compatible with electrical connectors 672 and/or 679 may be used with electronic device 170 even though they may not be directly compatible with electrical interface 172.

Protective case 100 may comprise a protective shell, a first electrical connector 654, a second electrical connector 672, and a third electrical connector 679. The protective shell may be configured or adapted for receiving electronic device 170 and covering at least a portion of electronic device 170 when electronic device 170 is installed in protective case 100. The protective shell includes an interior surface and an exterior surface. First electrical connector 654 is on the interior surface of the protective shell and may be configured or adapted for electrically connecting protective case 100 to electrical interface 172 of electronic device 170 when electronic device 170 is installed in protective case 100. Second electrical connector 672 is on the exterior surface of the protective shell and may be configured or adapted for electrically connecting a first external electrical device to installed electronic device 170 through electrical interface 172 of installed electronic device 170. Second electrical connector 672 is electrically connected to first electrical connector 654 through electrical circuitry 688 in protective case 100. Third electrical connector 679 is at or accessible on the exterior surface of the protective shell and may be configured or adapted for electrically connecting a second external electrical device to installed electronic device 170 through electrical interface 172 of installed electronic device 170. Third electrical connector 679 may be electrically connected to first electrical connector 654 through electrical circuitry 688.

Figure 7:
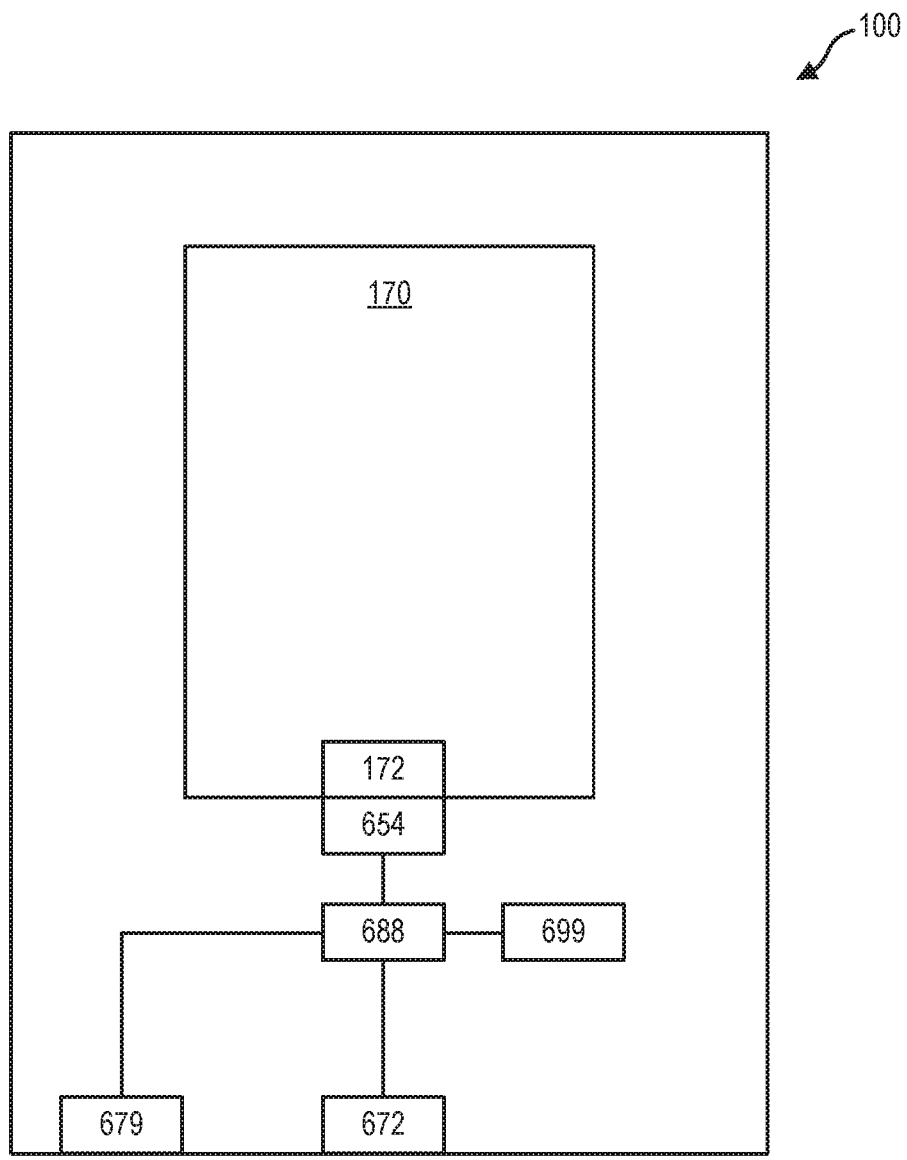
FIG. 7 illustrates a block diagram of a protective case.

FIG. 7 illustrates a variation of protective case 100 that optionally includes power storage device 699. Power storage device 699 may include one or more: rechargeable batteries, fuel cells, capacitors, supercapacitors, alkaline batteries, carbon-zinc batteries, nickel-metal hydride batteries, lithium batteries, lithium ion batteries, lithium titanate cells, and/or lithium polymer batteries. Power storage device 699 can be included to make protective case 100 a battery case and/or provide battery based functions in conjunction with the other techniques and features disclosed herein. Power storage device 699 may be charged or recharged using power received from an external device or power source through one or more of electrical connector 672 and electrical connector 679. Power storage device 699 may also be used to provide power to electronic device 170 or recharge electronic device 170 through electrical connector 654 and electrical interface 172 of electronic device 170.

In another variation, protective case 100 may include an inductive coil or other electrical circuitry for receiving electrical power wirelessly and/or transferring that received power to electronic device 170 and/or to power storage device 699, if present. Power may be wirelessly received through conventional induction, using resonant induction techniques, and/or using another type of wireless power transfer technique, including combinations thereof.

While the examples herein describe power or current as being received, delivered, and/or transferred, it should be understood that various additional functions may be performed with respect to the transferred power including power conditioning, voltage step up, voltage step down, current limiting, spike protection, surge protection, regulation, and/or overload protection. In addition, although a particular device, element, or circuit is described as delivering or transferring current or power, the current or power may not be literally conducted through that device, element, or circuit. In other words, the device, element, or circuit may directly or indirectly control one or more other devices, elements, or circuits that directly conduct the power or current.

FIGS. 5-7 illustrate signals received at electrical connector 654 from electronic device 170 being separated or split out among two electrical connectors on protective case 100. However, in some situations some of the signals received at electrical connector 654 may be directed to or through a wireless communication module. In other words, protective case 100 may include a wireless communication module in place of one of electrical connectors 672 and 679, or in addition to electrical connectors 672 and 679. Some of the electrical signals received at electrical connector 654 may be directed to the wireless communication module such that these signals are communicated from protective case 100 to an external electrical device using one or more wireless techniques. The wireless connection may conform to one or more wireless communication standards including WIFI, NFC, BLUETOOTH, and/or BLUETOOTH LOW ENERGY. The wireless communication may include data communications, electronic data communications, or any other electronic exchange of data or information between devices, in one direction, in the other direction, or in both directions.

In another variation, wireless communication may also take place between protective case 100 and electronic device 170 using any of the wireless communication techniques or standards discussed herein. The wireless communication may be in place of communication through electrical interface 172 and electrical connector 654, or may be in addition to the communication through electrical interface 172 and electrical connector 654.

The elements, components, and steps described herein are meant to exemplify some types of possibilities. In no way should the aforementioned examples limit the scope of the invention, as they are only exemplary embodiments.

The phrases "in some embodiments," "according to some embodiments," "in the embodiments shown," "in other embodiments," "in some examples," "in other examples," "in some cases," "in some situations," "in one configuration," "in other situations," "in another configuration," and the like generally mean that the particular technique, feature, structure, or characteristic following the phrase is included in at least one embodiment of the present invention and/or may be included in more than one embodiment of the present invention. In addition, such phrases do not necessarily refer to the same embodiments or to different embodiments.

The foregoing disclosure has been presented for purposes of illustration and description. Other modifications and variations may be possible in view of the above teachings. The embodiments described in the foregoing disclosure were chosen to explain the principles of the concept and its practical application to enable others skilled in the art to best utilize the invention. It is intended that the claims be construed to include other alternative embodiments of the invention except as limited by the prior art.

What is claimed is:

1. A protective case for an electronic device, the protective case comprising:
a protective shell configured for receiving the electronic device and covering at least a portion of the electronic device when the electronic device is installed in the protective shell, the protective shell having an interior surface and an exterior surface; a first electrical connector attached to the interior surface of the protective shell, the first electrical connector configured for electrically connecting to an electrical interface of the electronic device when the electronic device is installed in the protective case; a second electrical connector accessible at the exterior surface of the protective shell, the second electrical connector configured for conducting first electrical signals between the first installed electronic device and a first external electrical device connected to the second electrical connector, the first electrical signals conducted through the second electrical connector and the first electrical connector to the electrical interface of the installed electronic device; and a third electrical connector accessible at the exterior surface of the protective shell, the third electrical connector configured for conducting second electrical signals between the installed electronic device and a second external electrical device connected to the third electrical connector, the second electrical signals conducted through the third electrical connector and the first electrical connector to the electrical interface of the installed electronic device.

2. The protective case of claim 1 further comprising electrical circuitry, wherein the first electrical signals and the second electrical signals are conducted through the electrical circuitry.

3. The protective case of claim 2 wherein the electrical circuitry includes electrical conductors.

4. The protective case of claim 2 wherein the electrical circuitry multiplexes the first electrical signals from the second electrical connector and the second electrical signals from the third electrical connector, the multiplexed first and second electrical signals being conducted to the first electrical connector.

5. The protective case of claim 2 wherein the electrical circuitry demultiplexes electrical signals received from the first electrical connector to produce the first electrical signals and the second electrical signals, the first electrical signals conducted to the second electrical connector and the second electrical signals conducted to the third electrical connector.

6. The protective case of claim 2 wherein the electrical circuitry includes digital electrical components and analog electrical components.

7. The protective case of claim 2 wherein the electrical circuitry includes a computer processor.

8. The protective case of claim 2 further comprising a power storage device.

9. The protective case of claim 8 wherein the power storage device includes a rechargeable battery.

10. The protective case of claim 8 wherein the power storage device is configured to provide stored electrical power from the power storage device to the installed electronic device through the electrical circuitry and the first electrical connector.

11. The protective case of claim 8 wherein external electrical power is supplied to the power storage device through the second electrical connector, the electrical circuitry, and the first electrical connector.

12. The protective case of claim 1 wherein each of the first electrical signals and the second electrical signals includes one or more of unidirectional electrical signals and bidirectional electrical signals.

13. The protective case of claim 1 wherein each of the first electrical signals and the second electrical signals includes one or more of data and electrical power.

14. The protective case of claim 1 wherein the third electrical connector includes a headphone jack, the second external electrical device includes an audio device, and the second electrical signals include audio signals conducted from the installed electronic device to the headphone jack.

15. The protective case of claim 1 wherein the second electrical connector is configured for receiving electrical power from the first external electrical device.

16. The protective case claim 1 wherein the protective shell includes a first shell portion and a second shell portion that removably attaches to the first shell portion.

17. The protective case of claim 16 further including a seal that seals the first shell portion to the second shell portion to form a water resistant cavity for the electronic device.

18. The protective case of claim 1 further comprising a wireless communication module.

19. The protective case of claim 1 further comprising an inductive coil configured for one or more of wirelessly receiving electrical power and wirelessly transmitting electrical power.

20. The protective case of claim 1 further comprising a fourth electrical connector accessible at the exterior surface of the protective shell, the fourth electrical connector configured for conducting third electrical signals between the installed electronic device and a third external electrical device connected to the fourth electrical connector.

21. A case for an electronic device, the case comprising:
a shell configured for receiving the electronic device and covering at least a portion of the electronic device when the electronic device is installed in the shell, the shell having an interior surface and an exterior surface; electrical circuitry contained in the shell; a first electrical connector attached to the interior surface of the shell, the first electrical connector configured for electrically engaging an electrical interface of the electronic device when the electronic device is installed in the shell; a second electrical connector accessible at the exterior surface of the shell, the second electrical connector configured for conducting first electrical signals between the first installed electronic device and a first external electrical device connected to the second electrical connector, the first electrical signals conducted through the second electrical connector, the electrical circuitry, and the first electrical connector to the electrical interface of the installed electronic device; and a third electrical connector accessible at the exterior surface of the shell, the third electrical connector configured for conducting second electrical signals between the installed electronic device and a second external electrical device connected to the third electrical connector, the second electrical signals conducted through the third electrical connector, the electrical circuitry, and the first electrical connector to the electrical interface of the installed electronic device.

22. The case of claim 21 wherein the electrical circuitry is configured for multiplexing the first electrical signals and the second electrical signals.

23. The case of claim 21 wherein the electrical circuity is configured for demultiplexing the first electrical signals and the second electrical signals.

* * * * *